United States Patent [19]

Smith

[11] 4,237,547
[45] Dec. 2, 1980

[54] PROGRAM DECODER FOR SHARED CONTACT EPROM

[75] Inventor: Stephen L. Smith, Tempe, Ariz.

[73] Assignee: Motorola, Inc., Schaumburg, Ill.

[21] Appl. No.: 75,928

[22] Filed: Sep. 17, 1979

[51] Int. Cl.³ .............................................. G11C 11/40
[52] U.S. Cl. ................................... 365/189; 307/238; 365/104
[58] Field of Search ............... 365/189, 182, 185, 104, 365/230; 307/238

[56] References Cited

U.S. PATENT DOCUMENTS 4,184,207   1/1980   McElroy .............................. 365/104

Primary Examiner—Terrell W. Fears
Attorney, Agent, or Firm—Vincent B. Ingrassia

[57] ABSTRACT

In a shared contact electrically programmable read only memory, decoding circuitry is provided to prevent unwanted device programming due to sneak paths to ground. A two input NAND gate is coupled between adjacent column select lines. If either of the adjacent column select lines are energized, a data line will be enabled. Thus, for each column line energized, only two data lines will be enabled and only one of these will carry a voltage for enabling a memory device.

9 Claims, 2 Drawing Figures

PROGRAM DECODER FOR SHARED CONTACT EPROM

BACKGROUND OF THE INVENTION

This invention relates generally to semiconductor memory circuits and, more particularly, to an insulated gate field effect transistor (IGFET) decoder circuit for programming an electrically programmable read only memory (EPROM).

DESCRIPTION OF THE PRIOR ART

U.S. patent application Ser. No. 53,148 filed June 29, 1979 entitled "Apparatus for Programming a Dynamic EPROM" describes an apparatus wherein a programming voltage is applied to the floating gate of all memory devices corresponding to a selected row. A particular memory device in a row is then selected by applying a programming voltage to the drain of the selected device. While not shown in the drawing, it is stated that the drain of each device in a corresponding row is coupled to column select circuitry similar to the described row select circuitry.

It has been found, at least in the case of a read only memory (ROM), that a twenty percent savings in size can be achieved by using a shared contact approach. Efforts to extend this approach to EPROMs has met with certain obstacles, a major one of which is the production of sneak paths to ground which could result in the unintentional programming of a device.

SUMMARY OF THE INVENTION

It is an object of the present invention to provide an improved shared contact EPROM.

It is a further object of the present invention to provide a shared contact EPROM comprised of insulated gate field effect transistors which includes decoding circuitry to avoid false programming as a result of sneak paths to ground.

According to a broad aspect of the invention there is provided a decoding circuit for a shared contact electrically programmable read only memory including a plurality of pairs of memory devices arranged in a row and a plurality of column select lines wherein each pair of memory devices is coupled to a different column select line and wherein a first device in each pair is coupled to a first data line and a second device in each pair is coupled to a second data line, comprising: first means coupled between adjacent column select lines for sensing when one of said adjacent column select lines has been energized; and switching means coupled to said first means and responsive thereto for enabling said second data line.

According to a further object of the invention there is provided a shared contact electrically programmable read only memory, comprising: a plurality of pairs of memory devices arranged in at least one row; first and second data lines; a plurality of column select lines, each of said plurality of pairs of memory devices being coupled to a different one of said plurality of column select lines; first and second data lines, said first data line coupled to a first memory device in each of said plurality of pairs and said second data line coupled to a second memory device in each of said plurality of pairs; and a plurality of decoding circuits each one coupled between adjacent column select lines, each of said decoding circuits comprising: first means for detecting when one of said adjacent column select lines has been energized; and switching means coupled to said first means and responsive thereto for enabling the data line associated with said second device in each pair, the data line associated with the first device in each pair being controlled by another one of said decoding circuits coupled between said one of said adjacent column select lines and a next column select line.

The above and other objects, features and advantages of the present invention will be more clearly understood from the following detailed description taken in conjunction with the accompanying drawings in which:

DESCRIPTION OF THE PREFERRED EMBODIMENT

Figure 1:
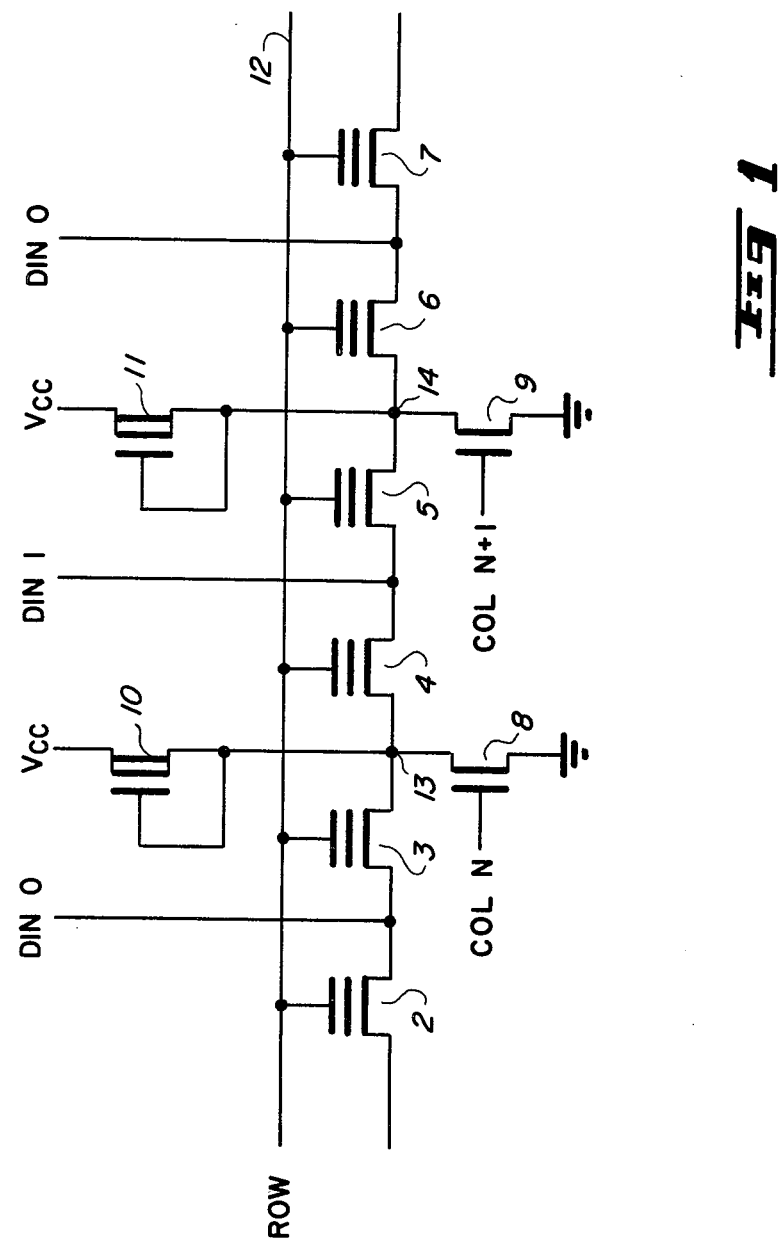
FIG. 1 is a schematic diagram of column select circuitry utilizing the shared contact approach according to the prior art.

FIG. 1 is a schematic diagram of a memory circuit which comprises a plurality of memory devices 2-7 each having a control gate and a floating gate, field effect transistors 10 and 11 of the depletion type and column select field effect transistors 8 and 9 of the enhancement type. It should be clear that a typical memory would comprise many rows and many columns and that circuit shown in FIG. 1 is merely representative of such a memory. Depletion devices 10 and 11 are coupled between $V_{CC}$ and nodes 13 and 14 respectively. As long as neither of the column select devices 8 and 9 have been energized by the application of a select voltage (typically 5 volts) to the gates of these devices, $V_{CC}$ (approximately 5 volts) will appear at nodes 13 and 14.

To program a particular memory device, a programming voltage (e.g. 25 volts) is applied to the row which is coupled to the control gate of the selected device. For example, if memory device 3 were to be programmed, the programming voltage would applied to row 12. A single column select device (e.g. device 8) is coupled to the contacts of two adjacent memory devices (3 and 4). Therefore, it is necessary that two separate data buses be employed. These are shown in FIG. 1 as DIN 0 and DIN 1. The arrangement operates as follows. If, for example, device 3 is to be programmed, a voltage (e.g. 5 volts) is applied to the gate of the column N (COL N) device 8 which turns the device on. This will cause node 13 (the electrodes of both devices 3 and 4) to be pulled to ground. Since each column select line is shared by two devices, two data bus lines DIN 0 and DIN 1 are utilized to assure that only one device of a selected pair will be programmed. In our case, a high voltage will be applied to the DIN 0 line and the DIN 1 line will be left floating. Since both the control gate and drain of device 3 is at a high voltage, charge will be injected onto the floating gate of device 3 thus programming device 3. A high voltage has not been applied to the drain of device 4 and therefore device 4 will remain unprogrammed.

The problem this arrangement presents when used in an EPROM is that other devices in the selected row may be inadvertently programmed as a result of sneak paths to ground. For example, the high voltage applied to the DIN 0 data bus between devices 2 and 3 will also appear between devices 6 and 7. Device 6 has a sneak path to ground (node 13 when column N is selected) through devices 5 and 4. In the read mode, this represents little problems since the signal is read very quickly. However, the programming mode takes substantially more time, and device 6 may be inadvertently programmed.

Figure 2:
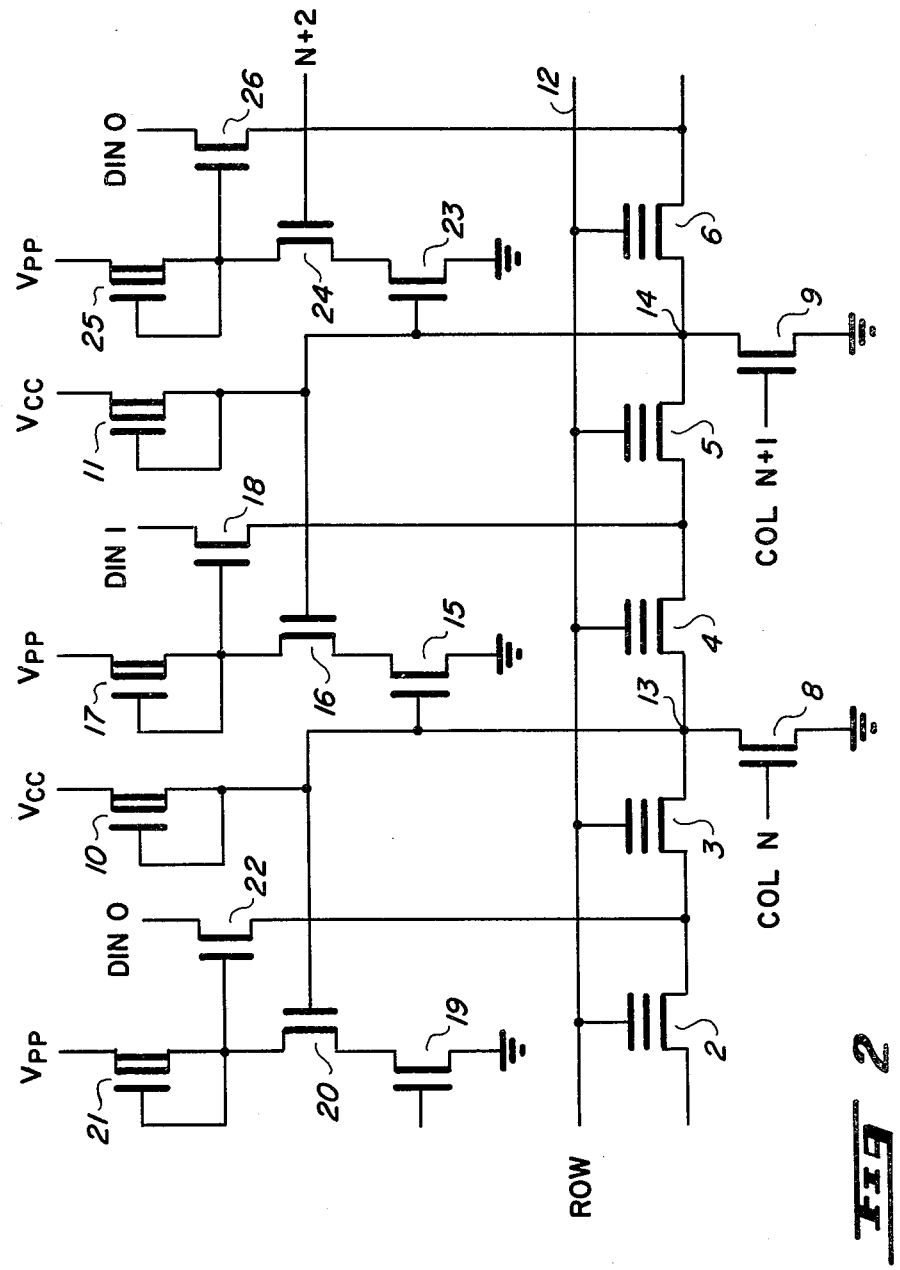
FIG. 2 is a schematic diagram of column select circuitry in accordance with the present invention.

The circuit shown in FIG. 2 is similar to that shown in FIG. 1 except for the addition of decoding circuitry which assures that a programming voltage will appear only on the data line of a selected device. The decoding circuitry includes a plurality of NAND gates only three of which are shown in FIG. 2. The first comprises field effect transistors 19 and 20, the second comprises field effect transistors 15 and 16 and the third comprises field effect transistors 23 and 24. The gate electrodes of each device in a particular NAND gate pair comprises the inputs to the NAND gate. For example, the NAND gate including devices 15 and 16 has a first input coupled to the drain of device 8 via node 13 and a second input coupled to the drain of device 9 via node 14. Let us assume that column N is selected which causes node 13 to be pulled to ground. This low voltage is applied to the gate electrode of enhancement device 15 and to the gate electrode of enhancement device 20. As a result, devices 15 and 20 will turn off. When this happens, depletion devices 17 and 21 each having a drain electrode coupled to $V_{pp}$ (approximately 25 volts) will cause the voltages on the gates of devices 18 and 22 respectively to rise to $V_{PP}$. Since devices 18 and 22 act as switches, any voltage on the DIN 0 or DIN 1 line will be applied to the drain electrode of memory devices 3 or 4 respectively.

Let us assume that it is device 3 which is to be programmed and a programming voltage is applied on the DIN 0 line. This is applied to the drain of device 3 since device 22 has been switched on by device 21. As was the case in FIG. 1, the DIN 0 voltage will also appear at the drain of device 26; however, device 26 will not be turned on because neither input to its corresponding NAND gate (the gate electrodes of devices 23 and 24) has gone low. This is true since neither column N+1 nor column N+2 has been selected. Therefore, since the drain of memory device 6 remains at a low voltage, device 6 cannot be inadvertently programmed due to the sneak path to ground (node 13).

The above description is given by way of example only. Changes in form and details may be made by one skilled in the art without departing from the scope of the invention as defined by the appended claims.

I claim:

1. A decoding circuit for a shared contact electrically programmable read only memory including a plurality of pairs of memory devices arranged in a row, first and second data lines and a plurality of column select lines wherein each pair of memory devices is coupled to a different column select line and wherein first and second devices in each pair are each coupled to a different one of said first and second data lines, comprising:
    first means coupled between adjacent column select lines for sensing when one of said adjacent column select lines has been energized; and
    switching means coupled to said first means and responsive thereto for enabling the data line associated with said second device in each pair, the data line associated with the first device in each pair being controlled by another one of said decoding circuits.

2. A decoding circuit according to claim 1 wherein said first means comprises a NAND gate having first and second inputs, each one of said first and second inputs being coupled to one of said adjacent column select lines.

3. A decoding circuit according to claim 2 wherein said NAND gate comprises:
    a first field effect transistor having source, gate and drain electrodes, said source electrode coupled to ground and said gate electrode coupled to one of said adjacent column select lines; and
    a second field effect transistor having source, drain and gate electrodes, said source electrode coupled to the drain of said first field effect transistor, said gate electrode coupled to a second one of said adjacent column select lines and said drain electrode coupled to said switching means.

4. A decoding circuit according to claim 3 wherein said switching means comprises a first field effect transistor having a source drain path coupled in series with said second data line and having a gate electrode coupled to the drain electrode of said second field effect transistor.

5. A shared contact electrically programmable read only memory, comprising:
    a plurality of pairs of memory devices arranged in at least one row;
    a plurality of column select lines, each of said plurality of pairs of memory devices being coupled to a different one of said plurality of column select lines;
    first and second data lines, said first data line coupled to a first memory device in each of said plurality of pairs and said second data line coupled to a second memory device in each of said plurality of pairs; and
    a plurality of decoding circuits each one coupled between adjacent column select lines, each of said decoding circuits comprising: first means for detecting when one of said adjacent column select lines has been energized; and
    switching means coupled to said first means and responsive thereto for enabling the data line associated with said second device in each pair, the data line associated with the first device in each pair being controlled by another one of said decoding circuits coupled between said one of said adjacent column select lines and a next column select line.

6. A shared contact electrically programmable read only memory according to claim 5 wherein each of said memory devices is a field effect transistor having source and drain electrodes, a control gate electrode and a floating gate.

7. A shared contact electrically programmable read only memory according to claim 5 wherein said first means comprises a NAND gate having first and second inputs each one coupled to one of said adjacent column select lines.

8. A shared contact electrically programmable read only memory according to claim 7 wherein said NAND gate comprises:
    a first field effect transistor having source, drain and gate electrodes, said source electrode coupled to ground and said gate electrode coupled to one of said adjacent column select lines; and
    a second field effect transistor having source, drain and gate electrodes, said source electrode coupled to the drain electrode of said first field effect transistors, said gate electrode coupled to a second one of said adjacent column select lines and a drain electrode coupled to said switching means.

9. A shared contact electrically programmable read only memory according to claim 8 wherein said switching means comprises a third field effect transistor having its current conducting path in series with said second data line and having a gate electrode coupled to the drain electrode of said second field effect transistor.

* * * * *